United States Patent [19]

Guarino

[11] 4,278,380
[45] Jul. 14, 1981

[54] LOCK AND ELEVATOR ARRANGEMENT FOR LOADING WORKPIECES INTO THE WORK CHAMBER OF AN ELECTRON BEAM LITHOGRAPHY SYSTEM

[75] Inventor: Nicholas Guarino, Arlington, Mass.

[73] Assignee: Varian Associates, Inc., Palo Alto, Calif.

[21] Appl. No.: 34,504

[22] Filed: Apr. 30, 1979

[51] Int. Cl.³ ............................................. B65B 21/02
[52] U.S. Cl. ................................. 414/217; 414/222; 414/331
[58] Field of Search ............... 414/217, 222, 225, 226, 414/331; 118/730, 733

[56] References Cited

U.S. PATENT DOCUMENTS

| | | | |
|---|---|---|---|
| 3,404,661 | 10/1968 | Mathias et al. | 414/217 X |
| 3,902,615 | 9/1975 | Levy et al. | 414/331 |
| 4,141,458 | 2/1979 | Brooks et al. | 414/331 |

Primary Examiner—Robert G. Sheridan
Attorney, Agent, or Firm—Stanley Z. Cole; Norman E. Reitz

[57] ABSTRACT

In apparatus having a work chamber in which workpieces are treated under high vacuum, that improvement comprising an inner chamber having a capacity for a plurality of workpieces, an outer chamber, vacuum means for evacuating the inner and outer chambers, a first valve for sealing between the work chamber and the inner chamber, a second valve for sealing between the inner and outer chambers, a third valve for sealing between the outer chamber and the atmosphere, loading means for loading workpieces through the third valve into the outer chamber from the atmosphere, and transfer means for transferring individual workpieces through the second valve between the inner and outer chambers, and for transferring individual workpieces through the first valve between the inner chamber and the work chamber.

2 Claims, 4 Drawing Figures

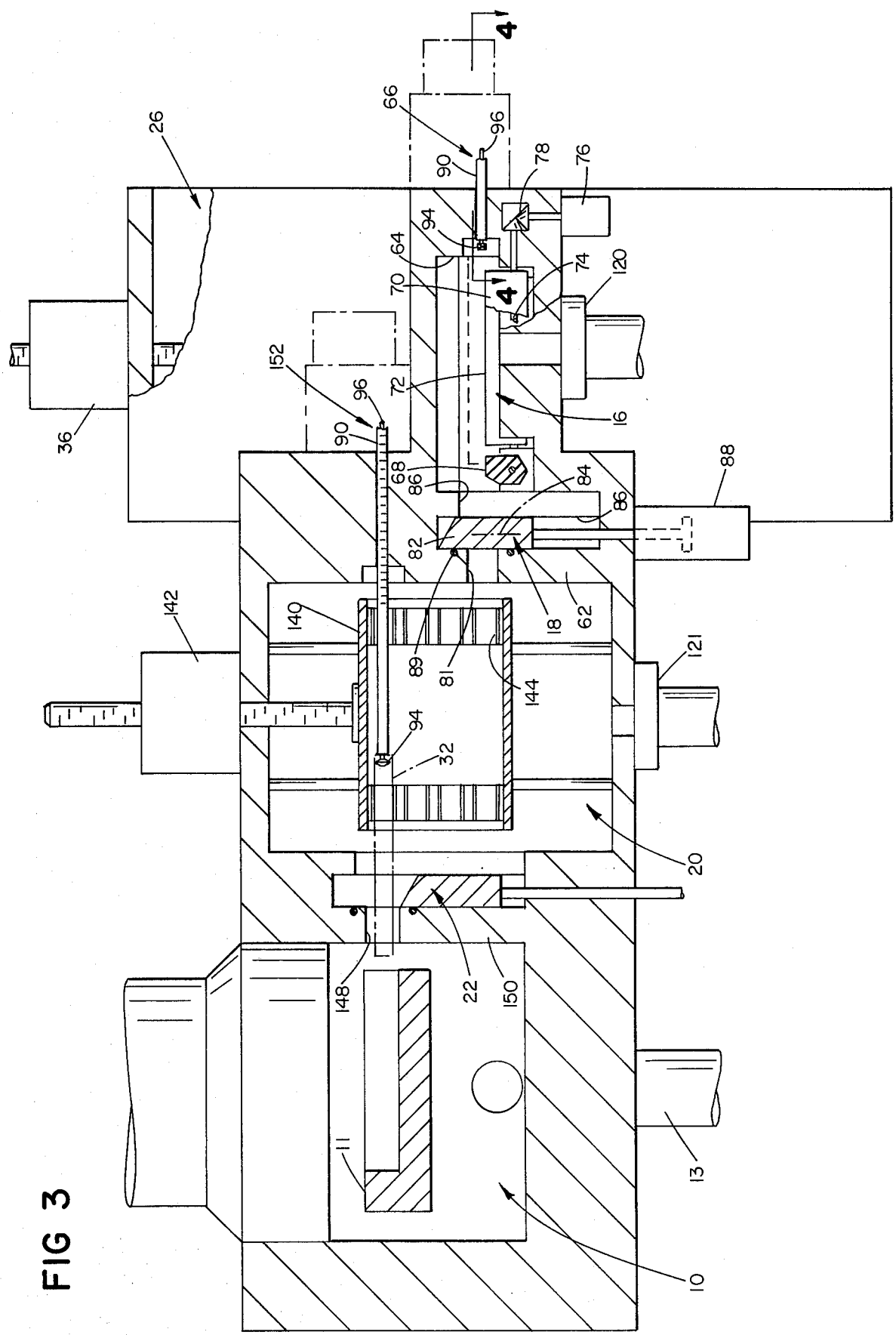

LOCK AND ELEVATOR ARRANGEMENT FOR LOADING WORKPIECES INTO THE WORK CHAMBER OF AN ELECTRON BEAM LITHOGRAPHY SYSTEM

BACKGROUND OF THE INVENTION

This invention relates to electron beam lithography, or similar systems in which a workpiece is treated in a high vaccum chamber.

Because of the expense of such systems it is important that their active operation time be maximized. It is thus desirable to minimize the downtime associated with loading workpieces into and out of the system.

Typically, some form of vacuum lock is used for loading workpieces.

Thus, in Hasson et al. U.S. Pat. No. 3,874,525, wafers are interchanged between an antechamber and an x-y table, and between the antechamber and the atmospheric pressure exterior.

In other prior art systems separate antechambers are used for loading and unloading wafers.

In yet another prior art system a single antechamber is arranged to receive two wafers simultaneously. An elevator is then used to cycle the wafers to and from the x-y table.

The possibility of loading a magazine of, say, four to ten cassettes into such an antechamber has also been disclosed, with suggested use of a roughing vacuum chamber in series with the antechamber. With a magazine in place, the roughing chamber would be pumped down to a rough vacuum. The magazine would then be transferred to the high vacuum antechamber.

SUMMARY OF THE INVENTION

This invention achieves a reduction in downtime by providing inner and outer vacuum chambers in association with the work chamber. In preferred embodiments, workpieces are loaded individually through the outer chamber (which is evacuated after receipt of each workpiece), into the inner chamber, which is always under vacuum. The inner chamber can hold several workpieces simultaneously. Individual workpiece exchange can take place between the work chamber and the inner chamber, and between the inner and outer chambers, at any time, even while other workpieces already written on by the electron beam remain in the inner chamber. Accordingly, downtime is limited to the brief time of exchange between the work chamber and the inner chamber. Moreover, workpieces with different cure time requirements can be loaded in the same magazine. The entire operation is under microprocessor control.

Other features of the invention will appear in the description of a preferred embodiment thereof, and in the claims.

DESCRIPTION OF THE PREFERRED EMBODIMENT

We turn now to a description of the preferred embodiment, first briefly describing the drawings.

DRAWINGS

FIG. 3 is a somewhat schematic sectional view taken along 3—3 of FIG. 1.

STRUCTURE

Figure 1:
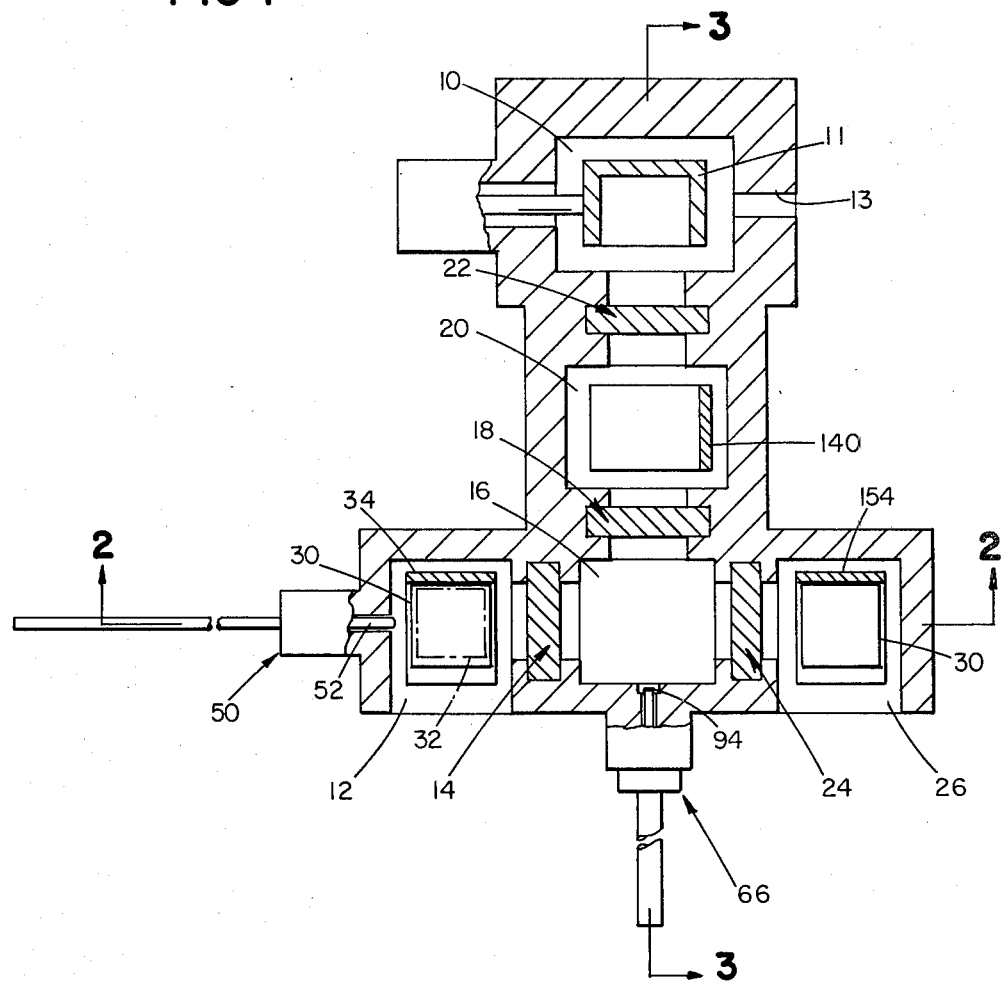
FIG. 1 is a somewhat schematic plan view, partly sectioned of a system embodying the invention.

Referring to FIG. 1, there is shown high vacuum writing chamber 10 in which a semi-conductor wafer (or other target) is supported in a cassette on an x-y table 11 and written on with an electron beam. Some details of a preferred x-y table are disclosed in a copending patent application of N. J. Guarino, X-Y Work Table, filed Apr. 30, 1979, U.S. application Ser. No. 34,505 and hereby incorporated by reference. Connection 13 is provided to evacuate the chamber.

The remainder of FIG. 1 shows the system for transporting cassettes to and from chamber 10. In general, a magazine of, say, ten cassettes is loaded into port 12. Individual cassettes from the magazine are then transported, one at a time, through valve 14 into outer vacuum chamber 16, and then through valve 18 into inner vacuum chamber 20. One cassette is then loaded through valve 22 into chamber 10 to be written on, and returned to chamber 20 for curing. Chamber 20 has space for four cassettes, and is always under vacuum so that a new cassette can be received from outer chamber 16 while, say two cassettes are being cured and a third is in chamber 10. After curing, cassettes are removed, one at a time, from inner chamber 20, through valve 18 to chamber 16, and through valve 24 to port 26.

Figure 2:
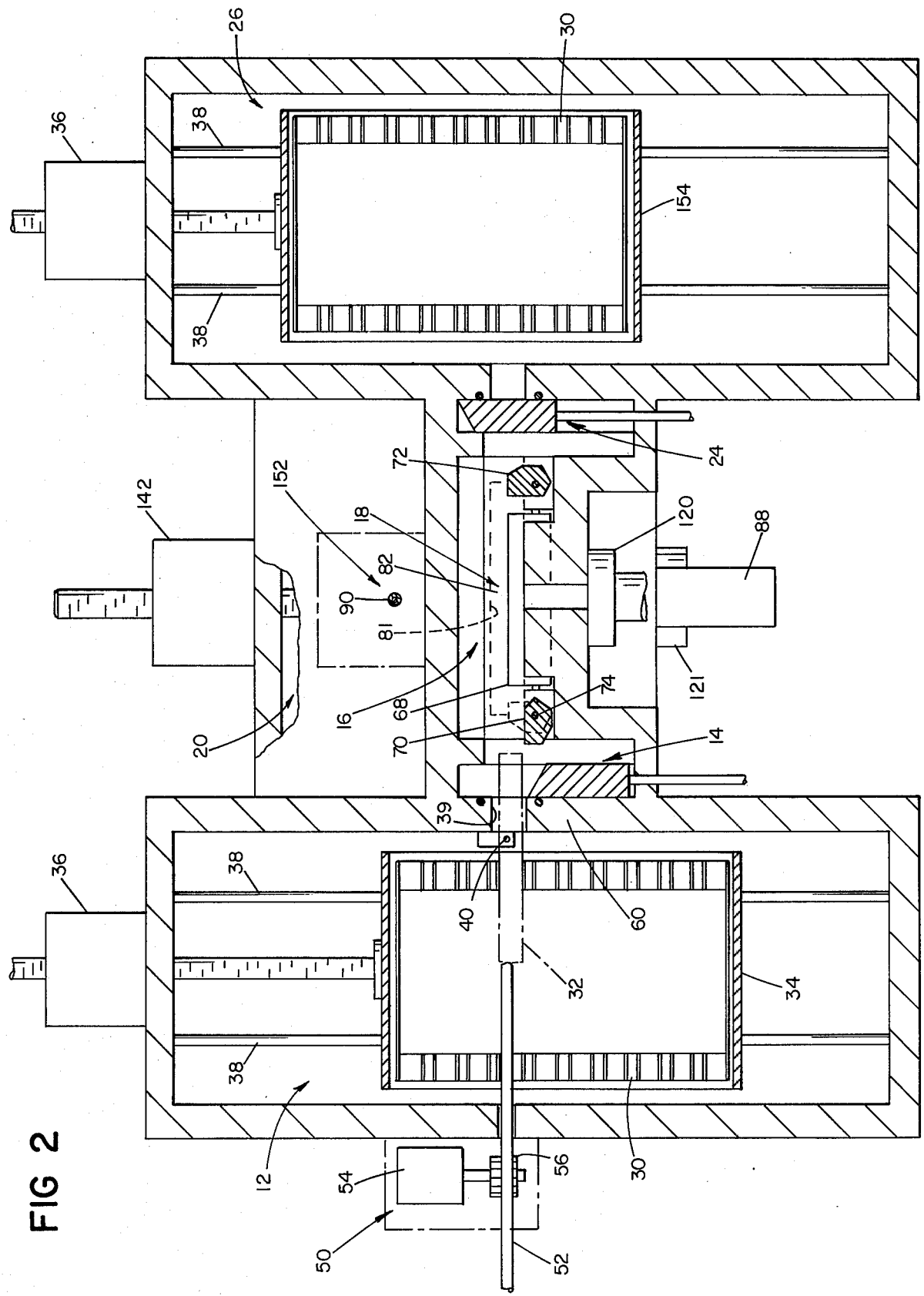
FIG. 2 is a somewhat schematic sectional view taken along 2—2 of FIG 1.

Details of port 12 are shown in FIGS. 1 and 2. Magazine 30, with shelves for the cassettes 32, fits in elevator 34. Drive 36 moves the elevator vertically on rods 38 to locate a selected cassette at orifice 39 for transport through valve 14 to chamber 16. Sensor 40 is mounted to respond to an identifying element (not shown) on each cassette so transported.

Shuttle 50 is arranged to transfer the individual cassettes from elevator 34 through valve 14 to chamber 16. In the shuttle, rack 52 is driven to the right (FIG. 2) by drive 54 through pinion 56 to force a cassette out the open side of elevator 34 and through valve 14 as desired. Drive 54 is then reversed to retract the rack.

Details of chamber 16 are shown in FIGS. 2 and 3. This chamber consists of a vacuum lock with a single cassette capacity. Valve 14 forms a part of chamber wall 60 (FIG. 2) and valve 18 part of wall 62 (FIG. 3). Inside chamber 16 is fixed guide wall 64 (FIG. 3), with which is associated shuttle 66, and three pivotable guide walls 68, 70 (FIG. 2), and 72. Wall 72 is representative of the pivotable guide walls; it is mounted (FIG. 3) on shaft 74 for pivoting by drive 76 through bevel gears 78, between horizontal and vertical positions. Guide walls 68, 70 and 72 (FIG. 2) arranged to cooperate with mating surfaces (shown in the above-identified copending application) on cassettes 32 to locate and guide the cassettes.

Valve 18 (FIG. 3) is representative of the four valves (14, 18, 22, 24) in the system. Wall 62 has aperture 81 through which a cassette can pass. Plate 82 is mounted to slide along axis 84 between wall 62 and wall portions 86, under the control of drive 88. When in the position shown in FIG. 3, plate 82 seals against o-ring 89 in wall 62, closing aperture 81.

Figure 4:
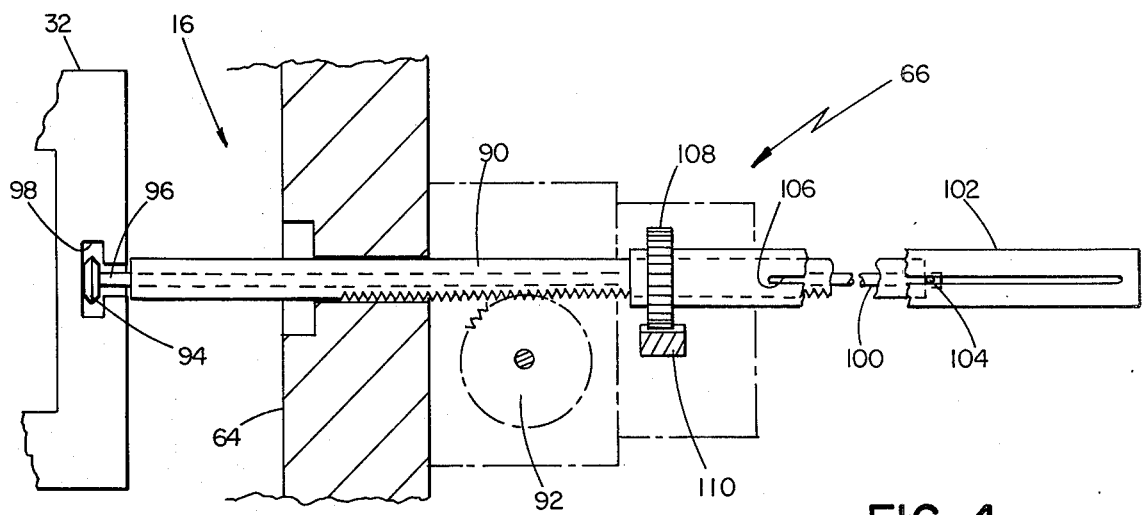
FIG. 4 is another somewhat schematic sectional view, taken along 4—4 of FIG. 3.

Shuttle 66 has a rack 90 (FIG. 4) and pinion 92 arrangement, generally as in shuttle 50. But, so that the same shuttle can move cassettes in both directions through valve 18, the cassette interface is through a key 94 carried on shaft 96 rotatable (but axially fixed) in rack 90. Key 94 is shaped to lock in keyway 98 of cassette 32, as shown, but to be freely movable in and out of the keyway when shaft 96 is rotated 90°. To rotate the shaft, its free end 100 is effectively splined to cylinder 102 by shaft pin 104 in slot 106 of the cylinder. The cylinder (and with it shaft 96) is driven through gear 108 and rack 110 (in turn driven by means not shown).

Referring to FIG. 3 connections 120 and 121 are provided to evacuate chambers 16 and 20.

Details of chamber 20 are shown in FIG. 3. Elevator 140 is moved up and down by ball screw drive 142. The elevator has four slots 144 to hold cassettes, which enter through wall 62 common to chambers 16 and 20. Valve 22 seals aperture 148 in wall 150, which is common to chambers 20 and 10. Shuttle 152, shown schematically, is the same as shuttle 66 (and its elements will be referred to below using the reference numerals used for shuttle 66).

Port 26 (FIGS. 1, 2) is similar to port 12. Rack 52 of shuttle 50 is long enough to push cassettes out of chamber 16, through valve 24, and into a magazine held in an elevator 154 in port 26.

Microprocessor circuitry and controls are provided for operating the system automatically.

OPERATION

In operation, chamber 10 and 20 are always under vacuum. A magazine 30 is loaded in elevator 34, and the elevator is moved to position the first cassette at aperture 39. With valve 14 open, but valve 18 (as well as valve 24) closed, shuttle 50 pushes that cassette into chamber 16. During entry of the cassette, guide wall 70 is horizontal, while wall 68 in its vertical position helps to guide the cassette. After shuttle 50 is retracted, valve 14 is closed, wall 70 raised, and chamber 16 evacuated. Valve 18 is then opened, wall 68 lowered to horizontal, and shuttle 66 operated (by simply advancing rack 90, it being unnecessary to lock key 94 in keyway 98) to push the cassette into elevator 140, which was positioned in chamber 20 to receive the cassette in the desired slot 144. During this movement walls 70 and 72 guide the cassette. Microswitches (not shown) signal the initial entry and complete reception of the cassette in slot 144. With shuttle 66 retracted, valve 18 is then closed and the elevator adjusted to position the cassette at aperture 148. Valve 22 is opened, and shuttle 152 is operated to push the cassette into chamber 10. Shuttle 152 is then retracted, and valve 22 closed.

While the first cassette is being written on in chamber 10, one or more additional cassettes may be loaded into elevator 140 in chamber 20 in the manner just described, so long as one slot 144 is left vacant. When writing on the first cassette is completed, elevator 140 is adjusted to position the vacant slot 144 at aperture 148, and valve 22 is opened. Shuttle 152 is operated to lock its key 94 in cassette keyway 98 by first advancing rack 90 and then rotating shaft 96 by 90°. Rack 90 is then retracted to draw the cassette into slot 144, after which key 94 is disengaged and the shuttle withdrawn. At this time elevator 140 can be moved to locate a new cassette at aperture 148, and shuttle 152 is operated to insert the new cassette into chamber 10. Valve 22 is then closed.

The written-on cassette is left in chamber 20 to cure, and is then withdrawn through valve 18 to chamber 16, and (with guide walls 70 and 72 lowered) through valve 24 to port 26. Port 26 is of course at atmospheric pressure, so that completed cassettes may be removed at any time. (Port 12 is of course also at atmospheric pressure.)

An important advantage of the invention is that two, or even more, cassettes may be left in chamber 20 to cure for different times. Another is that a new cassette is always ready in chamber 20 to exchange with one leaving chamber 10. In these ways, active utilization time for the system is maximized, as is its ability to simultaneously handle cassettes requiring different cure times.

Other embodiments are within the following claims.

What is claimed is:

1. A lock and elevator arrangement for loading workpieces into the work chamber of an electron beam lithography system in which the workpieces are to be treated by an electron beam in a high vacuum, a combination comprising:

an inner chamber positioned adjacent said work chamber and having a capacity for storing a plurality of either treated or untreated workpieces;

an outer chamber positioned adjacent said inner chamber;

vacuum means for evacuating and maintaining a high vacuum in said inner and outer chambers;

a first valve for effecting a vacuum seal between said work chamber and said inner chamber;

a second valve for effecting a vacuum seal between said inner and said outer chamber;

a third valve for effecting a vacuum seal between said outer chamber and the atmosphere, to thereby form an entrance lock;

loading means positioned adjacent said outer chamber for loading workpieces through said entrance lock into said outer chamber from the atmosphere, said loading means including elevator means for holding multiple workpieces and a pinion and rack means for precision movement of an individual workpiece through said entrance lock;

transfer means for transferring individual workpieces through said second valve means between said inner and outer chambers, and for transferring individual workpieces through said first valve between said inner chamber and said work chamber, said transfer means including rack and pinion means; and a fourth valve for effecting a vacuum seal between said outer chamber and the atmosphere, said fourth valve being positioned on said outer chamber on the opposite side of said outer chamber from said third valve, said fourth valve forming an exit lock.

2. A lock and elevator arrangement in accordance with claim 1 in combination with a sensor means mounted adjacent said third valve to sense an identifying element associated with each workpiece and thereby sense the insertion of each workpiece into said outer chamber.

* * * * *